United States Patent [19]
Bradley

[11] Patent Number: 5,308,429
[45] Date of Patent: May 3, 1994

[54] SYSTEM FOR BONDING A HEATSINK TO A SEMICONDUCTOR CHIP PACKAGE

[75] Inventor: Susan J. Bradley, East Hampstead, N.H.

[73] Assignee: Digital Equipment Corporation, Maynard, Mass.

[21] Appl. No.: 953,448

[22] Filed: Sep. 29, 1992

[51] Int. Cl.$^5$ ............................................. C09J 5/06
[52] U.S. Cl. ............................ 156/306.6; 156/307.1; 156/307.7
[58] Field of Search ............... 437/902; 156/321, 580, 156/583.1, 306.6, 307.1, 307.7, 196, 583.7; 29/831, 832; 361/400, 381, 386, 389; 257/706, 707, 713, 720, 722

[56] References Cited
U.S. PATENT DOCUMENTS

| | | | |
|---|---|---|---|
| 4,705,587 | 11/1987 | Smith | 156/321 |
| 5,106,451 | 4/1992 | Kan et al. | 156/580 |

FOREIGN PATENT DOCUMENTS 3145148  6/1991  Japan .

Primary Examiner—Michael W. Ball
Assistant Examiner—Richard Crispino
Attorney, Agent, or Firm—Albert P. Cefalo; Dirk Brinkman

[57] ABSTRACT

A method and apparatus for bonding a heatsink to a semiconductor chip package using localized pressure and conducted heat. A thermally conductive adhesive film is positioned between the heatsink and the package. A heated copper slug is positioned on top of the heatsink. Heat conducted from the slug and through the heatsink to the adhesive melts and cures the adhesive under a constant pressure supplied by the dead weight of the slug to create a bond-line having a desired thickness.

5 Claims, 1 Drawing Sheet

SYSTEM FOR BONDING A HEATSINK TO A SEMICONDUCTOR CHIP PACKAGE

FIELD OF THE INVENTION

This invention relates generally to bonding heatsinks to semiconductor chip packages, and more particularly to adhesively bonding heatsinks to semiconductor chip packages which are connected to a printed circuit board.

BACKGROUND OF THE INVENTION

A very significant limitation on the operation and reliability of semiconductor chip packages is the efficient extraction of heat. It is desirable to provide the packages, particularly high power packages, with an efficient heat transfer mechanism, such as heatsinks, to maintain them within a predetermined operating temperature range. It is a problem to reliably bond aluminum heatsinks to packages, specifically if the packages are made of, for example, a ceramic.

Heatsinks are normally bonded to semiconductor chip packages using an adhesive, typically an epoxy. In order for the epoxy to achieve the desired bonding strength to secure the heatsinks to the packages, pressure and heat are normally used during the bonding process. Pressure is used to attain the desired bond-line thickness, and heat is used to cure the adhesive.

In a known system (pre-reflow attachment), the adhesive, and sometimes an accelerator, are dispensed onto a heat removal surface of the semiconductor chip packages prior to assembling the packages onto a printed circuit board by, for example, soldering. The adhesive is usually spread on the package with a roller or dispensed in a dot pattern, or alternatively, deposited as a preformed film. The heatsinks are then pressed to the packages to obtain the desired bond-line thickness, typically by means of pneumatically operated pressure devices or springs. The packages with the heatsinks attached are cured in batches in a convection oven at a temperature between 150 and 180 degrees C. for thirty minutes or more. Adhesive films require that pressure be applied throughout the entire cure cycle. Subsequently, the packages, with the heatsinks attached, are assembled onto the printed circuit board by, for example, reflowing solder.

However, semiconductor chip packages with heatsinks attached are difficult to handle with automated insertion machines, such as vacuum pick-and-place tools. Planarity problems, due to misalignment between the heatsinks and the packages, and surface irregularities of the heatsinks, interfere with the insertion of the packages on the printed circuit board by the vacuum tools. In addition, as the size and power of the packages are increased so is the size of the heatsinks. The more massive packages and heatsinks generally require more complex and expensive pick-and-place tools. Also, as the size of the bonding area is increased with larger heatsinks, ceramic packages are more likely to be stressed to the point of fracture during the solder reflow process when the packages are connected to the printed circuit board.

Therefore, in an alternative system (post-reflow attachment), the heatsinks are attached to the semiconductor chip packages after the packages have been assembled onto the printed circuit board. In this system, the accelerator and the adhesive are dispensed onto the packages after the packages have been connected to the printed circuit board. This system has the disadvantage that a second heating cycle in the convection oven at a high temperature can not be used to cure the adhesive. Heating the adhesive to a high temperature may also cause the solder to reflow to disconnect the packages from the printed circuit board. Therefore, the adhesive is cured at room temperature, by way of example, for as long as a day. It is a problem to provide a constant pressure to the adhesive when the time for curing is extended.

Accordingly, the known systems for bonding heatsinks to semiconductor chip packages increase the cost of assembly, or do not always provide for efficient or reliable bonding.

Therefore, it is desirable to provide a system for reliably bonding heatsinks to semiconductor chip packages which is simple and uses readily available inexpensive materials and assembly equipment, and which is easily adaptable to mass production methods at reduced costs.

SUMMARY OF THE INVENTION

In accordance with the invention, there is provided a system, that is a method and apparatus, for bonding a heatsink to a semiconductor chip package. More particularly, the method and apparatus facilitate the bonding of a heatsink to a package which is already connected to a printed circuit board by solder.

According to the invention, the semiconductor chip package is first connected to a printed circuit board using conventional soldering techniques. A thermally conductive adhesive is subsequently positioned on a heat removal surface of the package, and a heatsink is positioned on the adhesive. A thermally conductive slug is heated by a heating element and positioned on the heatsink. Heat is conducted from the slug through the heatsink to the adhesive. The dead weight of the heated slug maintains the necessary pressure during curing to melt and flow the adhesive to a desired thickness to create a high strength bond between the heatsink and the semiconductor package.

In a preferred embodiment, the adhesive is in the form of a low modulus thermally conductive film. The thermally conductive slug is made of copper and is heated to a temperature in the range of 300 to 350 degrees C. by a cartridge heater. The weight of the slug is sufficient to apply a static pressure of about 1.5 pounds per square inch to the adhesive film. The adhesive is heated to a temperature of about 250 degrees C by heat conducted from the slug through the heatsink to the adhesive for a time period of approximately 30 seconds.

With the bonding system according to the invention, only the heatsink, adhesive, and a limited portion of the semiconductor chip package are subjected to excessive heat, thus preventing damage to the circuits inside the package or separation of the package from the printed circuit board. In addition, the higher temperature than is typically used in prior art bonding systems allows for more rapid curing of the bonding adhesive. Furthermore, the constant dead weight pressure of the slug eliminates the variables and costs introduced by prior art pneumatically operated pressure devices or spring.

These and other features and advantages of the present invention will become apparent from a reading of the detailed description in conjunction with the attached drawings in which like reference numerals refer to like elements in the several views.

DETAILED DESCRIPTION OF THE PREFERRED EMBODIMENT

Figure 1:
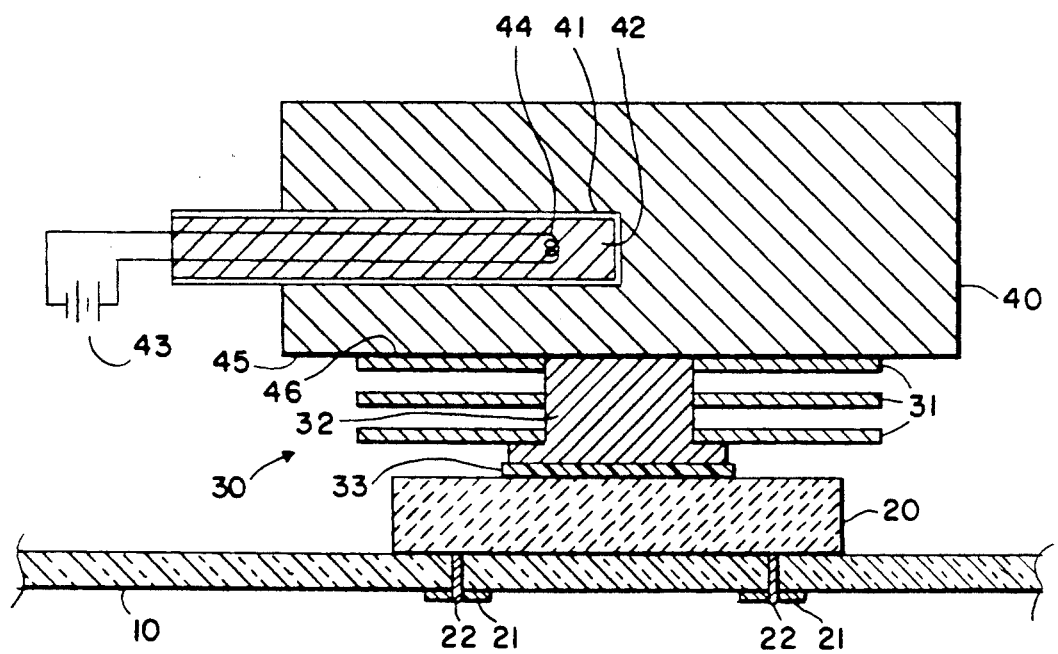
FIG. 1 is an elevated cross-section of the bonding system of the present invention.

FIG. 1 shows a printed circuit board 10 with a semiconductor chip package 20 mounted thereon. The package 20 is of the ceramic type. The package 20 is typically connected to circuit traces 21 formed on the printed circuit board 10 by means of pins 22. Typically, the pins 22 are soldered to the traces 21 by a wave soldering machine. Alternatively, the pins 22 of the package 20 are connected to the traces 21 of the printed circuit board 10 by surface mounting techniques.

During operation of the semiconductor chip package 20 heat is produced which must be removed to ensure the reliable operation of the circuits in the package 20. Therefore, the package 20 is provided with a heat removal surface 23 on one side thereof. A heatsink 30 is positioned in thermal contact with the heat removal surface 23 of the package 20. The heatsink 30 is typically sized in accordance with the size and heat dissipation requirements of the package 20. The heatsink 30 is, for example, of the tiered type, including a plurality of parallel fins 31, and a mounting base 32. The heatsink 30 is made of, for example, aluminum. The aluminum base 32 is bonded to the heat removal surface 23 of the ceramic package 20 by a thermally conductive adhesive 33.

In the preferred embodiment, the adhesive 33 is an alumina filled glass cloth supported adhesive film. For example, suitable films are the "ESP7355" (aluminum oxide) or the "ESP7358" (aluminum nitride filled) thermally conductive tack-free films made by AI Technology Inc., Trenton, N.J. This film has a thermal resistance of about 0.7 degrees C/Watt. An alternative film is the "516K" product made by Ablestik Laboratories, Gardena, Calif. A film has the advantage over an epoxy paste or liquid in that a film can easily be handled by a vacuum wand pick-up machine, and does not require complex dispensing and storage equipment as are required with epoxy pastes or liquids. Additionally, there is less of a chance for voiding in a film. Voids, or air pockets have a negative effect on the flow of heat from the package through the bond to the heatsink.

Pressure and heat bonding is used to melt and flow the adhesive 33 to the desired thickness, and to cure it. Accordingly, a generally cylindrically shaped slug 40 is provided as a source of heat and pressure. The slug 40 is made of a material with good thermal conductive characteristics, for example copper. The slug 40 includes a bore hole 41. The bore hole 41 extends approximately to the center of the slug 40. A heating element 42 is inserted in the bore hole 41. The bore hole 41 and heating element 42 are respectively sized to permit easy insertion of the heating element 42 in the bore hole 41 when the slug 40 is cool, but to provide an interference fit when the heating element 42 is slightly expanded during heating. The heating element 41 is operated by supplying a voltage from a power source 43 to a resistance coil 44 inside element 42. The heating element 42 can be a conventional cartridge type heater. The slug 40 is positioned in direct thermal contact with the heatsink 30. That is, the heatsink 30 is the conduit for heat transfer from the slug 40 to the adhesive 33. The cross-sectional contact area 45 of the slug 40 is made slightly larger than the cross-sectional contact area 46 of the heatsink 30 to compensate for any offset in placement of the slug 40 on the heatsink 30 during assembly.

Heat curing and compression of the adhesive 33 is achieved by heating the adhesive 33 to a temperature in the range of about 230 to 260 degrees C., preferably 250 degrees C. The adhesive 33 is maintained at the desired curing temperature for about 20 to 40 seconds, preferably 30 seconds. In order to heat the adhesive to the desired temperature, the slug 40 is heated, by means of the heating element 42, to a temperature in the range of about 300 to 350 degrees C., depending on the configuration of the tiered heatsink 30. That is, the tiered heatsink 30 may need to be heated to a higher or lower temperature, depending on the number of fins 31 which cause heat to be dissipated while the adhesive is cured. During heat curing the adhesive, a pressure of about 1.5 pounds per square inch is provided on the adhesive 33 by the dead weight of the slug 40. For example, for the adhesive 33 having a bond area of about 0.28 square inches, the slug 40 should have a mass of about 0.42 pounds. The dead weight of the slug 40 compresses the adhesive 33 from its original thickness in the range of 0.005 to 0.006 inch to the desired thickness of about 0.004 inch after curing.

Although the above description has proceeded with reference to bonding a heatsink to a semiconductor chip package which is connected to a printed circuit board, it is to be understood that the system as is disclosed herein may be adapted to a wide variety of bonding applications where there is a need to rapidly cure an adhesive without excessively overheating all of the components being bonded.

Therefore, the invention is not necessarily limited to the particular embodiment shown herein. It is to be understood that various other adaptations and modifications may be made within the spirit and scope of the invention as set forth in the claims.

What is claimed is:

1. A method for bonding a heatsink to a semiconductor chip package, comprising the steps of:
    mounting a semiconductor chip package including a heat removal surface on a printed circuit board;
    positioning a thermally conductive heat curable adhesive on said heat removal surface;
    positioning a heatsink on said thermally conductive heat curable adhesive;
    selecting a thermally conductive slug having a predetermined weight;
    placing said thermally conductive slug on said heatsink to melt, flow, and cure said thermally conductive heat curable adhesive by using heat supplied by said slug and pressure supplied by the weight of said slug.

2. The method as in claim 1 wherein said slug is made of copper and further including the step of inserting an electric heating element in a bore hole in said slug to heat said slug.

3. The method as in claim 1 further including the steps of heating said thermally conductive heat curable adhesive to a temperature in the range of about 230 to 260 degrees C. for a time period in the range of 30 to 40 seconds, and selecting the weight of said slug to compress said thermally conductive and heat curable adhesive with a pressure of about 1.5 pounds per square inch by the selected weight of said slug.

4. A method for bonding a heat sink to a component:

placing a heat curable adhesive on an electrical component mounted on a surface of a printed circuit board;

positioning a heatsink on said heat curable adhesive;

selecting a slug having a predetermined weight and a predetermined temperature;

placing said slug on said heatsink for a predetermined time to cure said heat curable adhesive by heat supplied by said plug and pressure supplied by the weight of said slug.

5. The method as in claim 4 further comprising the steps of:

heating said adhesive to a temperature of 230 degrees C. for 30 to 40 seconds while said weight maintains a pressure of 1.5 pounds per square inch on said adhesive.

* * * * *